United States Patent [19]

Lee et al.

[11] Patent Number: 5,225,631
[45] Date of Patent: Jul. 6, 1993

[54] LIQUID-PRESSURIZED RADIO FREQUENCY INTERFERENCE GASKET

[75] Inventors: Youn M. Lee, Clifton; Bruce T. Benwell; John Latess, both of Stafford, all of Va.

[73] Assignee: The United States of America as represented by the Secretary of the Army, Washington, D.C.

[21] Appl. No.: 762,997

[22] Filed: Sep. 20, 1991

[51] Int. Cl.⁵ ............... H05K 9/00; B65D 53/00; F16K 41/00
[52] U.S. Cl. .................. 174/35 GC; 174/35 R; 174/35 MS; 220/239; 277/34; 277/34.6
[58] Field of Search ............... 220/217, 225, 228, 239; 277/34, 34.3, 34.6; 174/35 GC, 35 R, 35 MS

[56] References Cited

U.S. PATENT DOCUMENTS

| | | | |
|---|---|---|---|
| 2,832,618 | 4/1958 | Knoll et al. | 277/34.3 |
| 3,764,037 | 10/1973 | Rothrock | 277/34.3 |
| 3,769,750 | 11/1973 | Mayer et al. | 49/477 |
| 4,177,353 | 12/1979 | McCormack | 174/35 |
| 4,260,164 | 4/1981 | Baker et al. | 277/34 |
| 4,300,775 | 11/1981 | Ringel | 277/34.3 |
| 4,371,175 | 2/1983 | Van Dyk, Jr. | 277/34 |
| 4,399,317 | 8/1983 | Van Dyk, Jr. | 174/35 |
| 4,722,151 | 2/1988 | Westwell | 49/477 |

Primary Examiner—Leo P. Picard
Assistant Examiner—Bot L. Ledynh
Attorney, Agent, or Firm—Saul Elbaum; Jason M. Shapiro

[57] ABSTRACT

A radio frequency gasket assembly having a flexible hollow tube enveloped by a conductive layer, and filled with an incompressible fluid. In one embodiment thereof, the undeformed gasket is filled with a sufficient volume of incompressible fluid such that when the gasket is compressed proper contact pressure is achieved between adjacent conductive surfaces of the enclosure. In another embodiment thereof, the undeformed gasket is filled completely with an incompressible fluid, such as ethylene glycol. When the gasket is compressed, a portion of the fluid is allowed to collect in a spring-loaded reservoir, preventing excessive pressure build-up and rupture. When the compressive force is removed, the collected fluid re-enters the gasket.

6 Claims, 3 Drawing Sheets

LIQUID-PRESSURIZED RADIO FREQUENCY INTERFERENCE GASKET

GOVERNMENTAL INTEREST

The invention described herein may be manufactured, used and licensed by or for the U.S. Government for governmental purposes without the payment to us of any royalties thereon.

BACKGROUND OF THE INVENTION

This invention relates to the field of radio frequency (RF) shielding, and more particularly to an electrically conductive gasket for use between adjacent conductive sections of a shielded enclosure.

A common problem associated with shielded enclosures is the loss of shielding effectiveness at the gap between the door and the door frame. Several approaches to providing a continuous electrically conductive medium between the door and the door frame have been employed in the past.

One approach involves the use of conductive finger stock on the door or door frame of the shielded enclosure. The finger stock is positioned to contact with a knife-edge extension on the opposite surface thereby establishing electrical connection between the two surfaces.

Another common approach involves the use of a wire mesh gasket which is mounted to the doors and hatches of a shielded structure. This comprises a solid polymer core surrounded by several concentric rings of conductive wire mesh. The gasket is made to fit within a channel around the perimeter of the door. As the door is closed, the gasket is compressed between the door channel and the frame of the shelter, thereby providing the necessary contact pressure between the gasket and the mating surfaces to establish electrical conductivity. The core should maintain a nearly constant pressure between the mating surfaces regardless of how many times it has been deformed in this manner.

With repeated use, however, the gasket core suffers permanent deformation, or "set", and fails to provide a constant pressure between the mating surfaces. In addition, gasket set frustrates the "cleaning action" experienced when a gasket is compressed onto a small bead, such as that found on a mating surface. Ordinarily, the sides of the bead rub against the gasket surface and scrape off oxides and other impurities which might impair electrical contact.

Experience has shown that the shielding effectiveness of mesh gaskets with polymer cores degrades rapidly after only a few months, after which time the permanent deformation adversely affects the gasket's ability to provide adequate shielding.

A discussion of the disadvantages inherent in these approaches can also be found in U.S. Pat. No. 4,177,353 (1979) to McCormack. McCormack teaches an inflatable tube with a sleeve or coating of conducting material for use as an RF gasket. The tube is fixedly mounted about the entire periphery of the door frame and is inflated with compressed air or some other compressed gas when the door is closed so as to provide electrical contact between the door and the shielded structure. The gasket must be deflated to either open or close the door.

A similar solution is proposed by Van Dyk, U.S. Pat. No. 4,371,175 (1983). A flattened inflatable elastomeric tube is disposed along the periphery of a conductive section of the shielded enclosure and provided with a loosely fitting conductive sheath. When the door to the enclosure is closed, the tube is inflated through introduction of compressed fluid such as air, thereby urging the shielding medium into conductive contact with adjacent sections of the enclosure.

The inflatable gaskets proposed by McCormack and Van Dyk must be deflated to either open or close the door to the enclosure. For this reason large volumes of compressed air or gas ar required for operation. This in turn necessitates the use of expensive equipment such as air compressors, and the constant availability of power. Air or gas tanks can be used, but in many applications these exceed size and weight limitations.

In addition, where conductive outer shells are used in conjunction with an elastomeric tubular core, the mesh must be large enough to accommodate the maximum expanded size of the hollow gasket core. Thus, when the gasket is deflated, the outer shell does not reduce in size and will become "baggy" in the gasket channel. This can cause two problems: first, it allows the gasket to pinch, preventing uniform surface conductivity, and second, it prohibits the natural cleansing action which occurs when a snug outer shell is pressed against the bead on the door frame.

SUMMARY OF THE INVENTION

Accordingly, it is an object of the present invention to provide an RF gasket which maintains proper contact pressure between adjacent conductive surfaces without undue inflation of the hollow tubular core thereby increasing operating life.

It is another object of this invention to provide an RF gasket which is substantially insensitive to changes in ambient temperature while maintaining proper contact pressure between adjacent conductive surfaces.

It is a further object of this invention to provide an RF gasket which maintains proper contact pressure between adjacent conductive surfaces without the use of air compressors or compressed gas tanks.

These objects and others not specifically enumerated are achieved by a gasket structure having a flexible hollow tube enveloped by a conductive layer, and filled with a compressible fluid, an incompressible fluid, or a combination of both compressible and incompressible fluids.

In one embodiment thereof, the undeformed gasket is filled with a sufficient volume of incompressible fluid such that when the gasket is compressed proper contact pressure is achieved between adjacent conductive surfaces of the enclosure.

In another embodiment thereof, the undeformed gasket is filled completely with an incompressible fluid, such as ethylene glycol. When the gasket is compressed, a portion of the incompressible fluid is allowed to collect in a spring-loaded reservoir or the like, preventing excessive pressure build-up and rupture. When the compressive force is removed, the collected fluid re-enters the gasket, which may then assume its original undeformed profile.

BRIEF DESCRIPTION OF THE DRAWINGS

The preferred embodiments of the present invention will be described with reference to the accompanying drawings.

DESCRIPTION OF THE PREFERRED EMBODIMENTS

The present invention is intended to improve the performance of an RF gasket through the use of a pressurized incompressible fluid core. This technique is different from the inflatable gaskets described previously in which gas pressure is used to expand the size of the gasket thereby increasing contact pressure. In the present invention the fluid-filled core is pressurized prior to compression in order to achieve a constant and reproducible contact pressure when compressed. When compressed, excess pressure build-up in the core is relieved, therefore the gasket is never overinflated.

Figure 1:
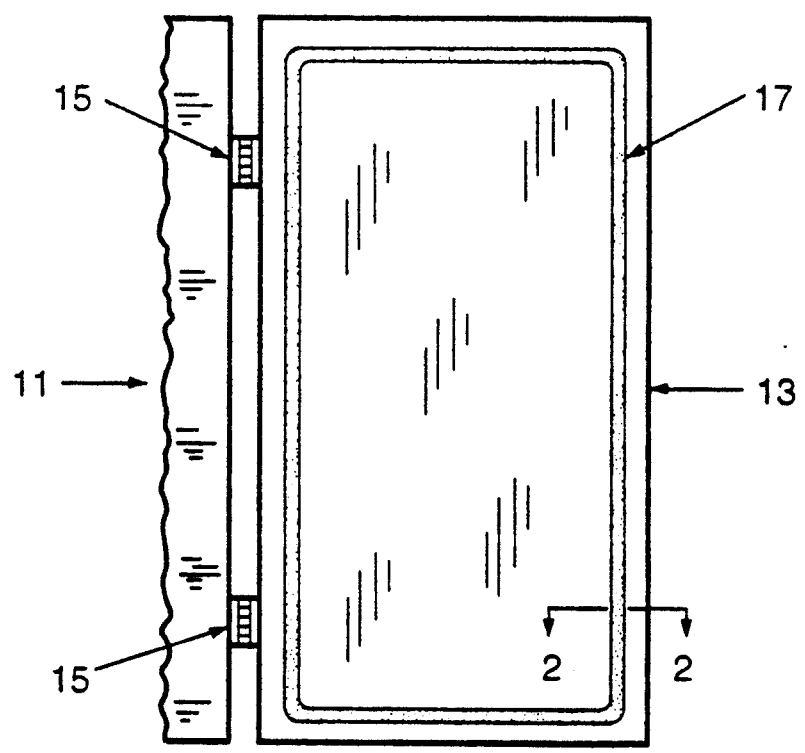
FIG. 1 illustrates a portion of a wall of an electromagnetically shielded enclosure having an opening or door frame closed by a hinged rectangular door having a fluid-filled RF gasket.

Referring to FIG. 1, a section of an opening or door frame 11 is shown as it relates to a door or hatch 13 meant to close that opening. For illustration purposes the door 13 is attached to the door frame 11 with hinges 15. Both the door frame 11 and the door 13 provide electromagnetic shielding. An RF gasket 17 is located around the periphery of the door 13, and may be flush-mounted or positioned within a groove formed in the door 13. When the door 13 is closed against the door frame 11 the gasket 17 is compressed to form a conductive medium between the door 13 and the shielded enclosure.

Figure 2A:
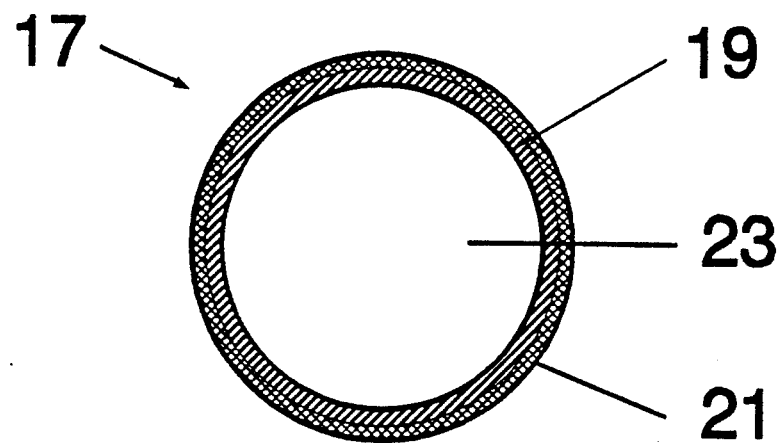
FIG. 2a and 2b, both taken along line 2—2 of FIG. 1, show two embodiments of a gasket according to the invention and in an undeformed state.
Figure 2B:
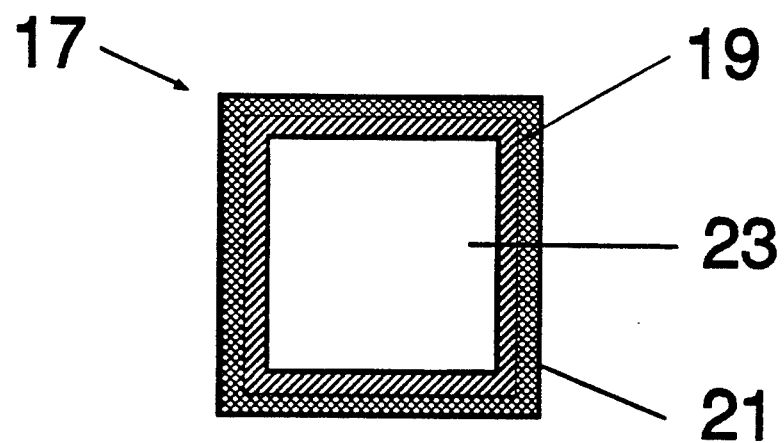

Two geometries of RF gasket 17 are shown in FIGS. 2a and 2b as cross-sections along line 2—2 of FIG. 1. Flexible hollow tubing 19 forms the core of the RF gasket 17. The tubing 19 can be any resilient elastomeric material, but is preferably made of silicon to withstand extreme temperatures. The tubing 19 can be made in one piece, or straight tubing can be cut and joined together with a suitable adhesive. If the tubing 19 is silicon, a silicon adhesive can be used to join the various sections, but most adhesives take a few days to cure fully.

A conductive layer 21 which encases the hollow tubing 19, can be formed by wrapping electrically conductive knitted wire mesh around the tubing 19, Or by bringing the tubing 19 into contact with finger stock (not illustrated). Because the wire mesh 21 is woven, it can be turned along a radius to follow the tubular core 19.

In one embodiment of the present invention, the undeformed tubular core 19 is partly or fully filled with an incompressible fluid 23. In the former case the internal pressure of the gasket 17 in its undeformed state is approximately ambient. In the latter case, where the incompressible fluid 23 fills the gasket core 19, the internal pressure can be anywhere between ambient and 25 psi. In either case, the internal pressure of the gasket 17 when compressed should be anywhere from 10-30 psi. To a certain extent this depends on the material chosen for use as a gasket core 19. For applications requiring temperature insensitivity, a suitable fluid would be ethylene glycol.

When the door 13 is closed against the door frame 11, the gasket 17 is compressed and the enclosed fluid 23 acts much like a prior art solid core material. But unlike a solid core, the fluid will suffer no permanent deformation, and will thus increase the operational life of the gasket 17. The tubing 19, however, must be elastic enough to sustain substantial deformation without rupturing.

Figure 3:
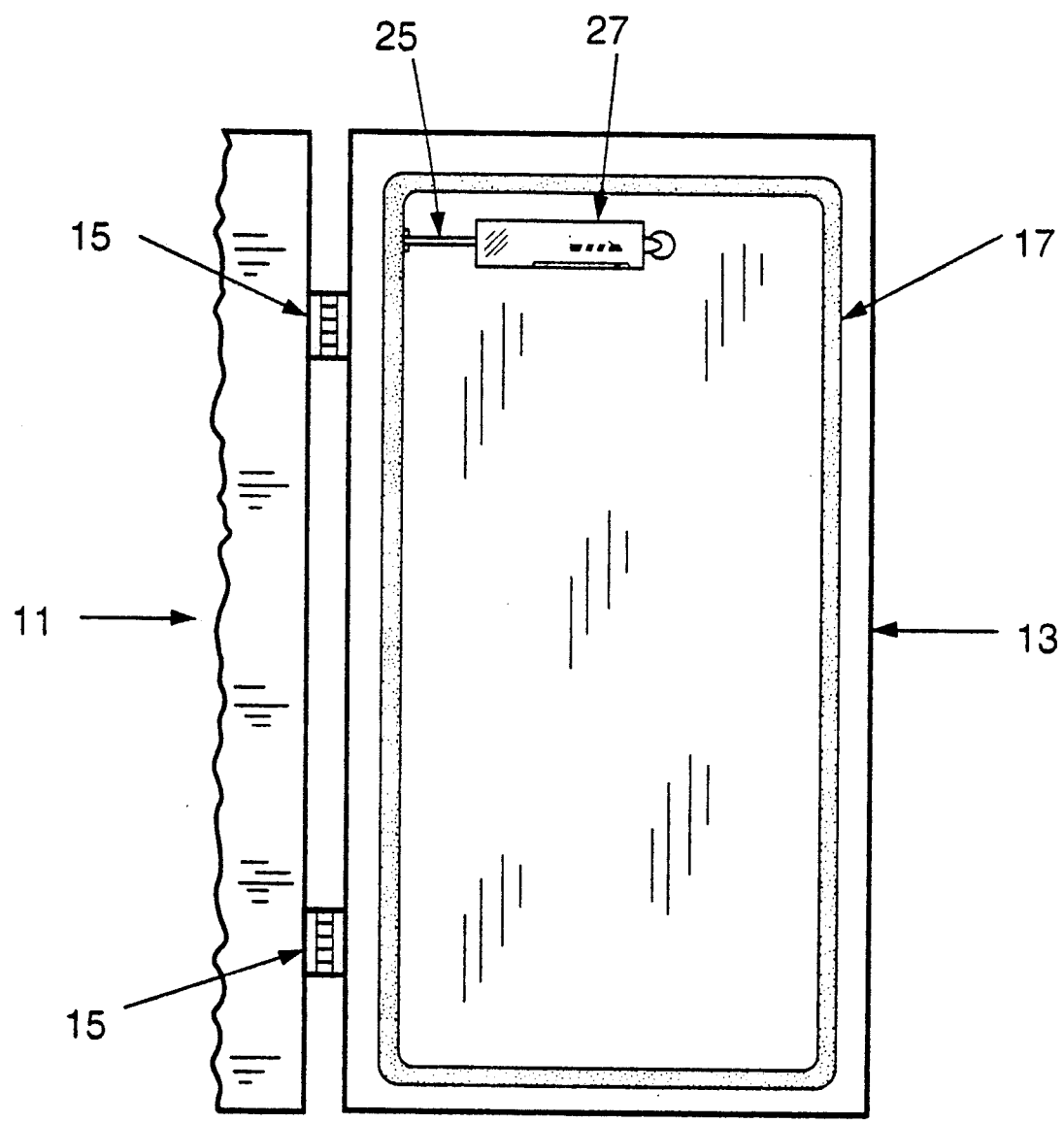
FIG. 3 illustrates a portion of a wall of an electromagnetically shielded enclosure having an opening or door frame closed by a hinged rectangular door having a fluid-filled RF gasket and a spring-loaded reservoir attached thereto.

In another embodiment of the present invention, illustrated in FIG. 3, a hollow tube 25 is disposed between the RF gasket 17 and a spring-loaded fluid reservoir 27 which can be mounted to the door 13. The undeformed gasket 17 is filled with an incompressible fluid 23, such as ethylene glycol. If excessive pressure (i.e. rupture pressure) is developed within the gasket 17 as the door 13 is closed, the excess pressure is taken up by the spring-loaded reservoir 27, thus preventing rupture of the tubular core 19. The spring constant of the reservoir 27 is chosen to maintain adequate internal pressure (ideally 10–30 psi) and contact force between the gasket 17, the door 13, and the door frame 11. when the door 17 is opened, the excess fluid held in the reservoir 27 will be injected back into the gasket 17 as a consequence of the pressure with which it was contained. The re-introduction of the excess fluid into the gasket 17 helps restore the hollow tubing 19 to its original, pressurized profile, as illustrated in FIGS. 2a and 2b.

While there has been described and illustrated specific embodiments of the invention it will be obvious that various changes, modifications and additions can be made herein without departing from the field of the invention which should be limited only by the scope of the appended claims.

We claim:

1. A gasket for use in a shielded enclosure comprising a flexible hollow tube and means for covering said hollow tube, wherein said covering means envelops said tube and is electrically conductive, and said hollow tube is partially filled with an incompressible fluid and sealed.

2. A gasket assembly for use in a shielded enclosure comprising a flexible hollow tube, means for covering said hollow tube, an incompressible fluid disposed within said hollow tube, and means for maintaining a substantially constant internal pressure within said tube, wherein said covering means envelops said tube and is electrically conductive, and said incompressible fluid is of sufficient volume to fill said hollow tube in the absence of compressive forces.

3. The invention of claim 2 wherein said means for relieving the internal pressure of said gasket comprises a spring-loaded reservoir.

4. The invention of claims 1, 2 or 3 wherein said incompressible fluid is ethylene glycol.

5. The invention of claims 2 or 3 wherein the mass of said incompressible fluid contained is such that an internal pressure of between 10 and 30 pounds per square inch is developed within said gasket when not in a compressed state.

6. The invention of claim 4 wherein the mass of said incompressible fluid contained is such that an internal pressure of between 10 and 30 pounds per square inch is developed within said gasket when not in a compressed state.

* * * * *